(12) United States Patent
Morrill

(10) Patent No.: US 6,249,148 B1
(45) Date of Patent: Jun. 19, 2001

(54) LOW POWER VARIABLE BASE DRIVE CIRCUIT

(75) Inventor: David P. Morrill, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/501,249

(22) Filed: Feb. 10, 2000

(51) Int. Cl.$^7$ .................................................. H03K 19/175
(52) U.S. Cl. .............................. 326/89; 326/90; 326/119; 326/124; 327/185
(58) Field of Search ................... 326/56, 57, 84, 326/89, 90, 119, 124; 327/185, 333, 391

(56) References Cited

U.S. PATENT DOCUMENTS

| | | | |
|---|---|---|---|
| 5,818,259 | * 10/1998 | Martin ..................................... | 326/84 |
| 5,852,383 | * 12/1998 | Rombach ............................. | 327/538 |
| 6,031,392 | * 2/2000 | Yee ........................................ | 326/80 |
| 6,100,712 | * 8/2000 | Anderson et al. ..................... | 326/18 |

* cited by examiner

Primary Examiner—Patrick Wamsley
Assistant Examiner—Vibol Tan
(74) Attorney, Agent, or Firm—Pierce Atwood; Chris A. Caseiro

(57) ABSTRACT

A variable base drive output circuit that is operational for low-potential power supplies. The output circuit includes a current regulating branch and a base drive branch. A control transistor is logically coupled to an enable signal and an input signal to be propagated. Activation of that control transistor establishes a current path to the base of a bipolar pulldown transistor that is coupled to output. The current regulating branch includes a resistance device in series with current limiting transistors. The resistance device is coupled to the control node of a base current transistor such that when the load on the output node drops, the current to the base of the pulldown transistor also drops. The result is a savings in Icc current for logic LOW signals at the output node. The variable base drive output circuit is operable for low supply potentials.

9 Claims, 2 Drawing Sheets

LOW POWER VARIABLE BASE DRIVE CIRCUIT

BACKGROUND OF THE INVENTION

1. Field of the Invention

The present invention relates to output circuits. In particular, the present invention relates to output circuits having bipolar pull up and pulldown transistors for propagating logic signals between integrated circuits. More particularly, the present invention relates to such output circuits having variable base drive suitable to operate the bipolar transistors under low power supply conditions.

2. Description of the Prior Art

Output circuits are used to transfer electrical signals between coupled circuits. This may be achieved in a variety of well-known ways. In the field of semiconductor devices, integrated output circuits are established by coupling together active devices that may be controlled to define the potential propagated by such circuits. It is well known that in digital systems the signals moving between devices are categorized as either logic level HIGH (or "1" or "ON") and logic level LOW (or "0" or "OFF"). The particular signal potential that defines whether a HIGH or a LOW signal is transmitted is dependent upon the semiconductor components that form the circuitry associated with that transmission. The most common circuit configurations used to produce digital signals include, among others, CMOS, Transistor-Transistor Logic (TTL), and Emitter-Coupled Logic (ECL). Each of these logic configurations operates differently as a function of the "swing" between what constitutes a HIGH signal and what constitutes a LOW signal.

For CMOS logic, which is based primarily on the use of Metal-Oxide-Semiconductor (MOS) transistors, a LOW signal is generally developed in the range of 0.6 volts (V) above a low-potential power rail GND, which may be at 0.0V. A HIGH signal is generally developed in the range of Vcc to Vcc-0.6V, where Vcc may vary between 3.0V and 3.6V for a nominal 3.3-volt supply and between 1.9V and 2.5V for a nominal 2.2-volt supply. For a 2.2-volt supply then, the differential swing between LOW and HIGH must be at least 1.3 volts in order to ensure that a desired shift between LOW and HIGH will occur.

TTL, ECL, and other logic configurations, on the other hand, are based primarily on the use of bipolar transistors. The differential swing for a shift between a LOW and a HIGH is significantly less than it is for CMOS operation—it may be as low as 0.5V. For Positive ECL systems, for example, the swings are even closer. In PECL circuitry, which is Vcc dependent, a HIGH is equivalent to a potential of about Vcc-0.9V, and a LOW is equivalent to a potential of about Vcc-1.7V. Thus, in mating CMOS and non-CMOS transmissions, it can be seen that variations in potential swings will not automatically ensure the triggering of a desired swing from one logic level to another, particularly as available supply potentials are reduced. Further, it is to be noted that bipolar transistors, unlike MOS transistors, require sufficient base drive to ensure their operation.

As transistors become increasingly smaller in order to achieve the faster transmission rates of interest and lower power consumption, the corresponding differential swings associated with their logic outputs are reduced. Unfortunately, circuits that in the past had available sufficient power and logic swing ranges to operate as required, may have difficulty performing as expected as power and logic ranges are reduced. This is of particular concern when using bipolar transistors, which transistors consume more power than MOS transistors but which tend to operate more quickly.

Output circuits typically employ a pull up transistor for propagating logic HIGH signals associated with the Vcc potential, and pulldown transistors for propagating logic LOW signals, again associated with the Vcc potential. For bipolar transistor based output circuits, it is desirable to minimize their power consumption by operating them as a function of the loading applied to the output circuit. In particular, if the load at the circuit output node, which may be coupled to a bus, increases, it is preferable to be able to increase the base drive to the bipolar transistor in order to ensure that the output signal remains the same. Alternatively, when the load at the output is reduced, it is desirable to reduce the base drive, thereby saving power. This may be achieved with a feedback loop coupled to the output node to sense load changes and produce a changed base drive to the bipolar output transistor.

An existing output circuit mixing MOS and bipolar devices for the purpose of enabling variable bipolar output transistor base drive is shown in FIG. 1. The prior variable base drive output circuit includes first regulating PMOS transistor M1 activated by an enable signal at its gate provided through enable node EN. Current regulating resistor R1 supplies, when M1 is on, current $I_c$, through always-on NMOS transistor M2 to the collector of pull down bipolar transistor Q1. The operation of M2 is maintained stable by control through a stable reference source Vref that is not subject to the range of swings that may be experienced by high-potential supply rail Vcc. When the logic signal to be propagated to the output node OUT of the output circuit is LOW, Q1 must be operative. That occurs when the incoming signal at node DATA is a logic HIGH in the circuit of FIG. 1.

The current $I_c$ through Q1 is defined by the characteristics of that pull down transistor as well as the base drive current $I_b$ applied to the base of Q1. The base drive current $I_b$ is defined by a base-drive-controlling branch that includes pass through NMOS transistors M4 and M5 and feedback transistor M3. When the load on the output node OUT of the output transistor is reduced, the current through current-limiting resistor R1 increases and the current through base-drive-controlling branch decreases. As a result, the base drive current $I_b$ applied to the base of Q1 decreases. Conversely, a greater load at OUT causes an increase in the current through the branch including feedback transistor M3 so as to increase the base drive to Q1. This arrangement minimizes current loss by minimizing $I_c$ during logic LOW outputs and varied loads at OUT.

The variable base drive output circuit of FIG. 1 works well for Vcc of about 2.7V or above. However, because there are vagaries associated with the fabrication of the active devices of the output circuit of FIG. 1, it is necessary to size those devices and couple them in a manner that ensures the worst fabrication variability possibilities will not cause failure of the circuit. As a result, for power supplies at potentials less than 2.7V, the output circuit of FIG. 1 fails to provide satisfactory signal propagation with minimal power consumption. In particular, the potential drops across M3 ($V_t$), M4 and M5 ($2V_{DS}$), and Q1 ($V_{BE}$), when added up, limit the current to be supplied to the base of Q1 such that it cannot be operated under all conditions. For that reason, at low supply potentials, the output circuit of FIG. 1 fails to operate.

Therefore, what is needed is an output circuit having the capability to supply variable base drive to the pull down bipolar transistor thereof. What is also needed is such a variable base drive output circuit that is operational with low power supply potentials.

SUMMARY OF THE INVENTION

It is an object of the present invention to provide an output circuit having the capability to supply variable base drive to the pull down bipolar transistor thereof. It is also an object of the present invention to provide a variable base drive output circuit that is operational at low power supply potentials including, but not limited to, below Vcc=2.7V.

These and other objectives are achieved in the present invention by eliminating current-control transistors M4 and M5 of FIG. 1 and re-configuring the input and feedback transistor couplings. Specifically, the variable base drive output circuit of the present invention includes the bipolar pulldown transistor as before. However, the base of that transistor is no longer coupled through three potential drops. Instead, the pulldown transistor base is coupled to two controlling transistors, thereby eliminating one potential drop in a manner that ensures operation of Q1 with low supplies without compromising the feedback that enables base drive variability as a function of load on the output node. This is made possible by coupling the enable and input signals to the circuit in a logical configuration that maintains the signal relationship necessary to control the condition of Q1 as well as the feedback loop.

These and other advantages will become apparent upon review of the following detailed description of the embodiments of the invention, the accompanying drawings, and the appended claims.

DETAILED DESCRIPTION OF THE PREFERRED EMBODIMENT OF THE INVENTION

Figure 1:
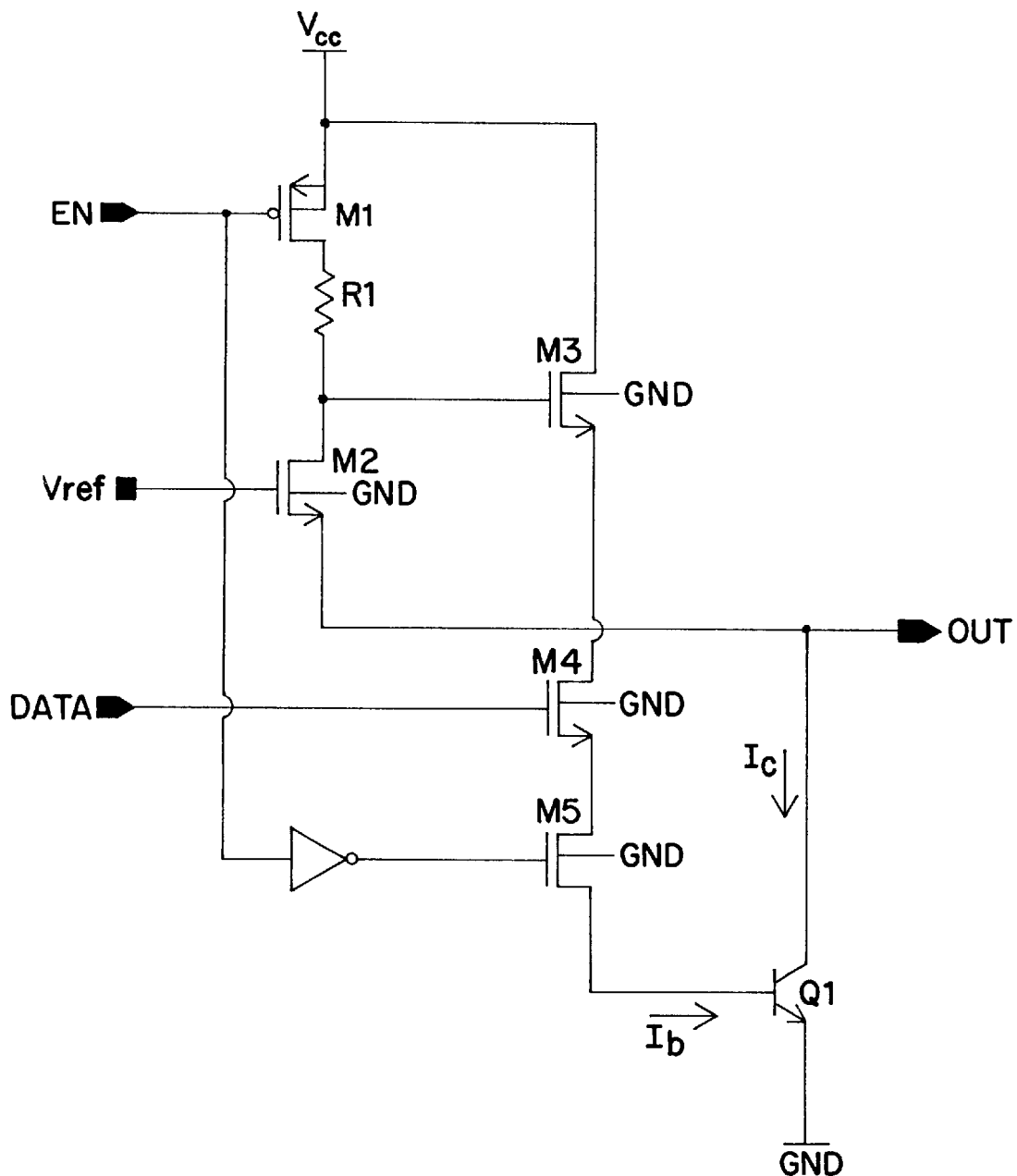
FIG. 1 is a schematic diagram of a prior-art output circuit including a bipolar pulldown transistor with a variable base drive arrangement.
Figure 2:
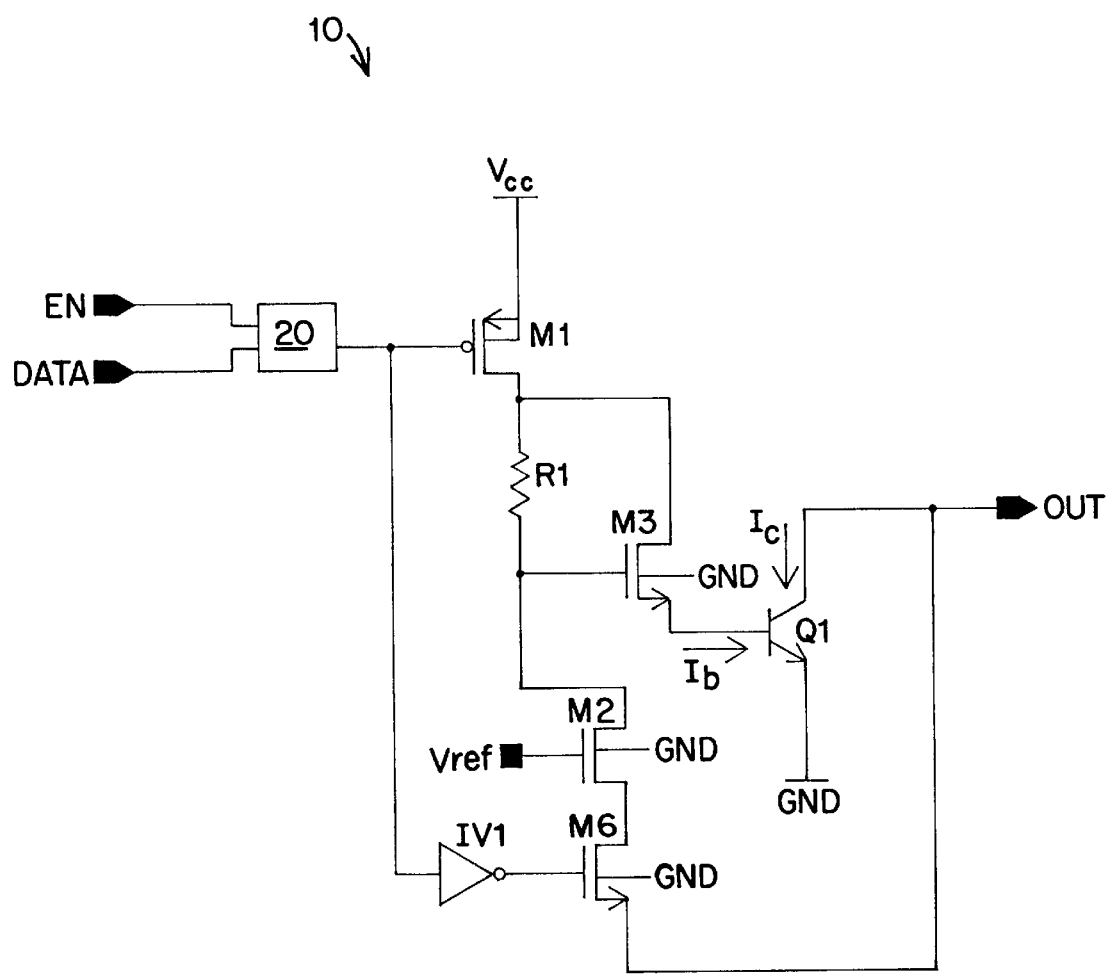
FIG. 2 is a schematic diagram of the low-power variable base drive output circuit of the present invention.

As illustrated in FIG. 2, a low-power variable base drive output circuit 10 of the present invention includes bipolar pulldown transistor Q1 for establishing a logic LOW signal at output OUT as a function of a signal to be propagated entering the circuit 10 at input node DATA. The output circuit 10 is enabled by way of a signal received at enable node EN. The signals at EN and at DATA are combined logically through logic gate 20 such that the circuit 10 is enabled when the signal at control PMOS transistor M1 is a logic LOW. Those skilled in the art will be able to devise a logic arrangement for logic gate 20 to produce the signals for operation of the circuit 10 and the propagation of a signal corresponding to the signal at DATA. Such a logic gate 20 may be formed from any of a combination of AND, NAND, OR, NOR, and XOR gates, or other suitable device.

The circuit 10 further includes a base drive current regulating branch formed of transistor M1 and feedback NMOS transistor M2. Transistor M1 has its source and bulk coupled to high-potential supply rail Vcc and its drain coupled to the drain of transistor M3. Transistor M3 has its source coupled to the base of bipolar pulldown transistor Q1. The potential drops across M1 and M3 define the current supplied to the base of pulldown transistor Q1. The current passing through current-limiting resistor R1 in turn defines their current. Resistor R1 has its high-potential node coupled to the drain of M1 and its low-potential node coupled to the gate of M3. This arrangement for M3 ensures that the base drive of Q1 is turned off when the circuit 10 is disabled. Transistor Q1 has its collector coupled to OUT, its base coupled to the source of M3, and its emitter coupled to low-potential supply rail GND.

The current passing through R1 is defined by the state of output-coupled transistors M2 and M6. Transistor M2 is always on in that its gate is coupled to stable gate supply potential Vref. It is to be noted that the Vref value sets potential value of a logic low output by the circuit 10 as selected by the user. Transistor M2 has its drain coupled to the low-potential node of R1 and its source coupled to the drain of transistor M6. Transistor M6 has its gate coupled to the output of inverter IV1, which has its input coupled to the output of logic gate 20. This arrangement keeps M6 on when circuit control transistor M1 is on. Finally, the source of M6 is coupled to OUT. Transistor M6 acts to isolate OUT from a possible leakage path during overvoltage conditions at that node. Further, the delay through inverter IV1 allows the gate of M3 to be driven to the potential of Vcc before the comparator circuit established by M2 and R1 turns on. This momentarily increases the potential to transistor M3 such that maximum base drive is supplied to Q1. That is, when the output of circuit 20 is a logic LOW to the gate of M1, the potential to the source of M3 is driven essentially to the full-rail potential of Vcc. That occurs because the output of IV1 lags behind such that M6 remains off. That interaction speeds up the turn-on of Q1. When the IV1 output switches to activate M6, the supply from the source of M3 is reduced and the base current $I_b$ is also reduced.

In operation, a logic LOW at the gate of M1 enables the circuit 10 by turning on that PMOS transistor. At the same time, transistor M6 is turned on such that current passes through the branch including M1, R1, M2, and M6. The potential at the gate of M3 is sufficient to turn that transistor on, thereby generating a current path from Vcc through M1 and M3. This current is sufficient to drive Q1 on so that the output signal at OUT is pulled LOW. The turning on of Q1 generates a current $I_c$. As the load on OUT is reduced, the base drive to Q1 is substantially reduced so that $I_c$ is reduced. Energy is saved in the circuit 10 through reduction of the base drive current $I_b$. Further, since there are potential drops only by way of M1, M3, and Q1, the present invention has sufficient headroom to remain operable for Vcc potentials below 2.7V.

While the present invention has been described with specific reference to particular embodiments, it is to be understood that all modifications, variants, and equivalents are deemed to be within the scope of the following appended claims.

What is claimed is:

1. An output circuit for propagating an electrical signal from an input node to an output node, wherein the output circuit is couplable between a high-potential power rail and a low-potential power rail, wherein the output circuit includes an enable node for receiving an enable signal, and a bipolar pulldown transistor having a collector coupled to the output node, the circuit comprising:

a. a control transistor having a control node coupled to the enable node and a high-potential node coupled to the high-potential power rail;

b. a base drive branch having a high-potential node coupled to a low-potential node of the control transistor and a low-potential node coupled to the base of the bipolar pulldown transistor; and c. a base-current regulating branch having a high-potential node coupled to said low-potential node of said control transistor and a low-potential node coupled to the output node of the circuit, wherein said base-current regulating branch regulates current delivered to the base of the bipolar pulldown transistor.

2. The circuit as claimed in claim 1 further comprising a logic gate having an input coupled to the enable node and the input node and an output node coupled to said control node of said control transistor.

3. The circuit as claimed in claim 2 wherein said base-regulating branch includes a resistance device having a high-potential node coupled to said low-potential node of said control transistor and to said high-potential node of said base drive branch, a first regulating transistor having a high-potential node coupled to a low-potential node of said resistance device, and a second regulating transistor having a high-potential node coupled to a low-potential node of said first regulating transistor and a low-potential node coupled to the output node of the output circuit.

4. The circuit as claimed in claim 3 further comprising an inverter having an input node coupled to said output node of said logic gate and an output node coupled to a control node of said second current-regulating transistor.

5. The circuit as claimed in claim 4 wherein said base drive branch includes a base drive transistor having a high-potential node coupled to said low-potential node of said control transistor, a control node coupled to said low-potential node of said resistance device, and a low-potential node coupled to the base of the bipolar pulldown transistor.

6. The circuit as claimed in claim 5 wherein said first regulating transistor of said current-regulating branch has a control node coupled to an independent reference potential.

7. The circuit as claimed in claim 6 wherein said control transistor is a PMOS transistor.

8. The circuit as claimed in claim 7 wherein said first regulating transistor, said second regulating transistor, and said base drive transistor are NMOS transistors.

9. The circuit as claimed in claim 8 wherein said resistance device is a resistor.

* * * * *